United States Patent
Shimizu et al.

(10) Patent No.: US 12,202,124 B2
(45) Date of Patent: Jan. 21, 2025

(54) SUBSTRATE CONVEYING ROBOT

(71) Applicant: KAWASAKI JUKOGYO KABUSHIKI KAISHA, Kobe (JP)

(72) Inventors: Ippei Shimizu, Kobe (JP); Ryunosuke Takauji, Kobe (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 0 days.

(21) Appl. No.: 18/024,554

(22) PCT Filed: Nov. 2, 2020

(86) PCT No.: PCT/JP2020/041032
§ 371 (c)(1),
(2) Date: Mar. 3, 2023

(87) PCT Pub. No.: WO2022/049789
PCT Pub. Date: Mar. 10, 2022

(65) Prior Publication Data
US 2023/0330863 A1 Oct. 19, 2023

(30) Foreign Application Priority Data
Sep. 3, 2020 (JP) .................. 2020-148498

(51) Int. Cl.
*B25J 9/00* (2006.01)
*B25J 9/02* (2006.01)
*B25J 11/00* (2006.01)
*B25J 19/00* (2006.01)

(52) U.S. Cl.
CPC ......... *B25J 11/0095* (2013.01); *B25J 9/0009* (2013.01); *B25J 9/023* (2013.01); *B25J 19/00* (2013.01)

(58) Field of Classification Search
CPC ......... H01L 21/67742; H01L 21/67766; H01L 21/6838; H01L 21/68707; B25J 9/042; B25J 9/043; B25J 19/00; B25J 9/0009; B25J 9/023; B25J 11/0095
See application file for complete search history.

(56) References Cited

U.S. PATENT DOCUMENTS

| | | | |
|---|---|---|---|
| 5,826,129 A * | 10/1998 | Hasebe | H01L 21/67178 414/416.03 |
| 2010/0290872 A1 | 11/2010 | Bonora et al. | |
| 2010/0290873 A1 | 11/2010 | Bonora et al. | |
| 2015/0063958 A1 | 3/2015 | Bonora et al. | |
| 2018/0096873 A1 | 4/2018 | Bonora et al. | |
| 2019/0054613 A1 * | 2/2019 | Shibata | B25J 9/06 |

FOREIGN PATENT DOCUMENTS

| | | | |
|---|---|---|---|
| CN | 108698222 A | | 10/2018 |
| JP | 10157847 A | * | 6/1998 |
| JP | H10-157847 A | | 6/1998 |
| JP | 11123691 A | * | 5/1999 |
| JP | 2003229355 A | * | 8/2003 |

(Continued)

*Primary Examiner* — Gerald McClain
(74) *Attorney, Agent, or Firm* — Oliff PLC

(57) ABSTRACT

A substrate conveying robot includes a cable guide that is arranged inside a housing, in which a robot cable extending from an arm is arranged, and that deforms to follow the robot cable moved as the arm is moved up and down.

13 Claims, 8 Drawing Sheets

(56) References Cited

FOREIGN PATENT DOCUMENTS

| | | | | |
|---|---|---|---|---|
| JP | 2005101080 A | * | 4/2005 | |
| JP | 2013022715 A | * | 2/2013 | .......... B25J 19/0025 |
| JP | 2013-69914 A | | 4/2013 | |
| JP | 2016-141565 A | | 8/2016 | |
| JP | 2017148925 A | * | 8/2017 | .......... B25J 11/0095 |
| JP | 2018-131334 A | | 8/2018 | |
| KR | 10-2000-0018640 A | | 4/2000 | |

* cited by examiner

SUBSTRATE CONVEYING ROBOT

TECHNICAL FIELD

The present invention relates to a substrate conveying robot, and more particularly, it relates to a substrate conveying robot including a robot cable extending from an arm.

BACKGROUND ART

Conventionally, a substrate conveying robot is known. Such a substrate conveying robot is disclosed in Japanese Patent Laid-Open No. 2013-069914, for example.

Japanese Patent Laid-Open No. 2013-069914 discloses a substrate conveying robot that is a horizontal articulated robot. This substrate conveying robot includes a base, an arm connected to the base and rotating in a horizontal plane, and substrate conveying hands connected to the arm and rotating in the horizontal plane.

Although not clearly described in Japanese Patent Laid-Open No. 2013-069914, conventional substrate conveying robots as described in Japanese Patent Laid-Open No. 2013-069914 include a substrate conveying robot including an arm moved up and down by an elevating mechanism.

PRIOR ART

Patent Document

Patent Document 1: Japanese Patent Laid-Open No. 2013-069914

SUMMARY OF THE INVENTION

Problems to be Solved by the Invention

In the substrate conveying robot including the arm moved up and down, a robot cable that extends from the arm as the arm is moved up and down and a cable guide that guides the robot cable are moved as the arm is moved up and down. In this case, dust and the like may disadvantageously spread in a space (such as a clean room) in which the substrate conveying robot is arranged as the robot cable and the cable guide are moved.

The present invention is intended to solve the above problems. The present invention aims to provide a substrate conveying robot each capable of reducing or preventing spreading of dust and the like in a space in which the substrate conveying robot is arranged.

Means for Solving the Problems

A substrate conveying robot according to an aspect of the present invention includes a substrate holding hand, an arm to move the substrate holding hand, an arm elevating mechanism to move the arm up and down, a substantially columnar housing to cover the arm elevating mechanism, and a cable guide that is arranged inside the housing, in which a robot cable extending from the arm is arranged, and that deforms to follow the robot cable moved as the arm is moved up and down.

As described above, the substrate conveying robot according to this aspect of the present invention includes the cable guide that is arranged inside the housing, in which the robot cable extending from the arm is arranged, and that deforms to follow the robot cable moved as the arm is moved up and down. Accordingly, the robot cable and the cable guide are arranged inside the housing, and thus even when the robot cable and the cable guide are moved inside the housing, spreading of dust and the like outside the housing can be reduced or prevented. Consequently, in a space (in a clean room) in which the substrate conveying robot is arranged, spreading of dust and the like can be reduced or prevented.

Effect of the Invention

According to the present invention, as described above, it is possible to reduce or prevent spreading of dust and the like in the space in which the substrate conveying robot is arranged.

MODES FOR CARRYING OUT THE INVENTION

An embodiment embodying the present invention is hereinafter described on the basis of the drawings.

The configuration of a substrate conveying robot 100 according to this embodiment is now described with reference to FIGS. 1 to 9.

Figure 1:
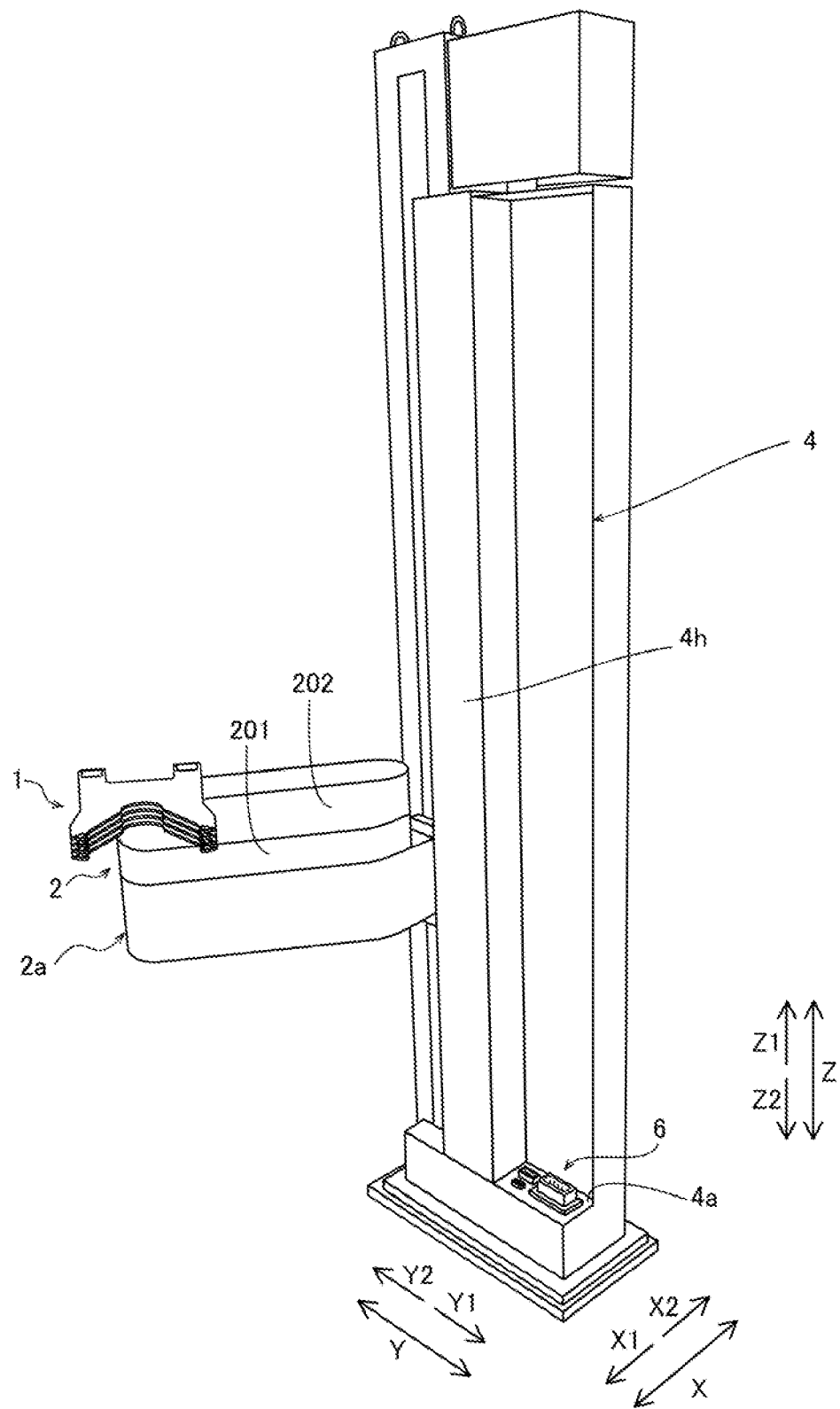
FIG. 1 is a perspective view of a substrate conveying robot according to an embodiment of the present invention.
Figure 2:
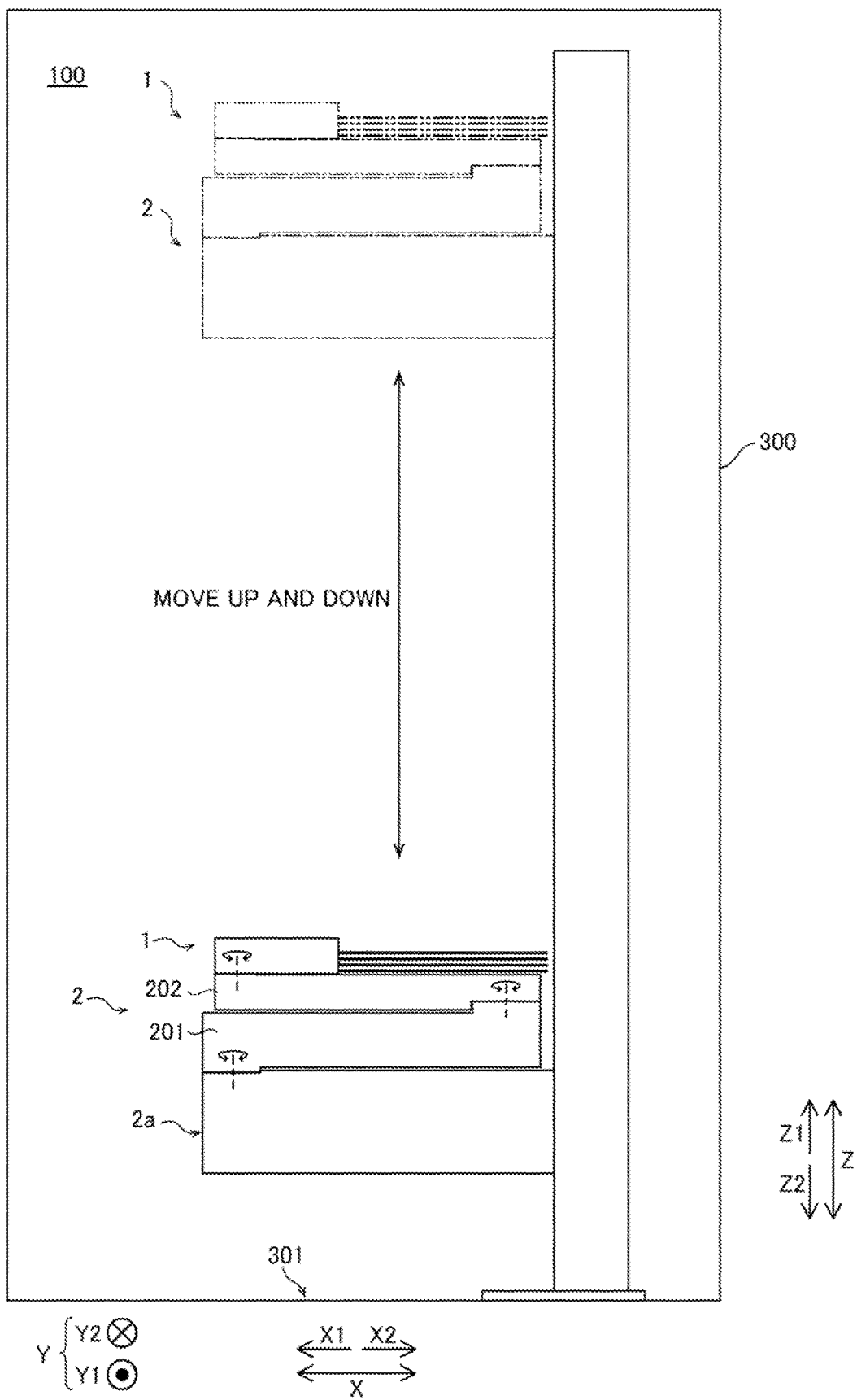
FIG. 2 is a side view (a view from the Y1 direction side) of the substrate conveying robot according to the embodiment of the present invention.

As shown in FIGS. 1 and 2, the substrate conveying robot 100 includes a substrate holding hand 1 that holds substrates (semiconductor wafers) and an arm 2 that moves the substrate holding hand 1.

As shown in FIGS. 1 and 2, the arm 2 is a horizontal articulated robot arm. The arm 2 includes a first arm 201 and a second arm 202. The first arm 201 is rotatable with respect to a base 2a, which is described below, with a first end as the center of rotation. Specifically, the first end of the first arm 201 is rotatably connected to the base 2a via a first joint. The second arm 202 is rotatable with respect to the first arm 201 with a first end as the center of rotation. Specifically, the first end of the second arm 202 is rotatably connected to a second end of the first arm 201 via a second joint. The substrate holding hand 1 is rotatably connected to a second end of the second arm 202 via a third joint. A drive mechanism including a servomotor corresponding to a drive source for rotary drive, a rotational position sensor that detects the rotational position of an output shaft of the servomotor, and a power transmission mechanism that transmits the output of the servomotor to the joint is provided at each of the first joint, the second joint, and the third joint.

Figure 3:
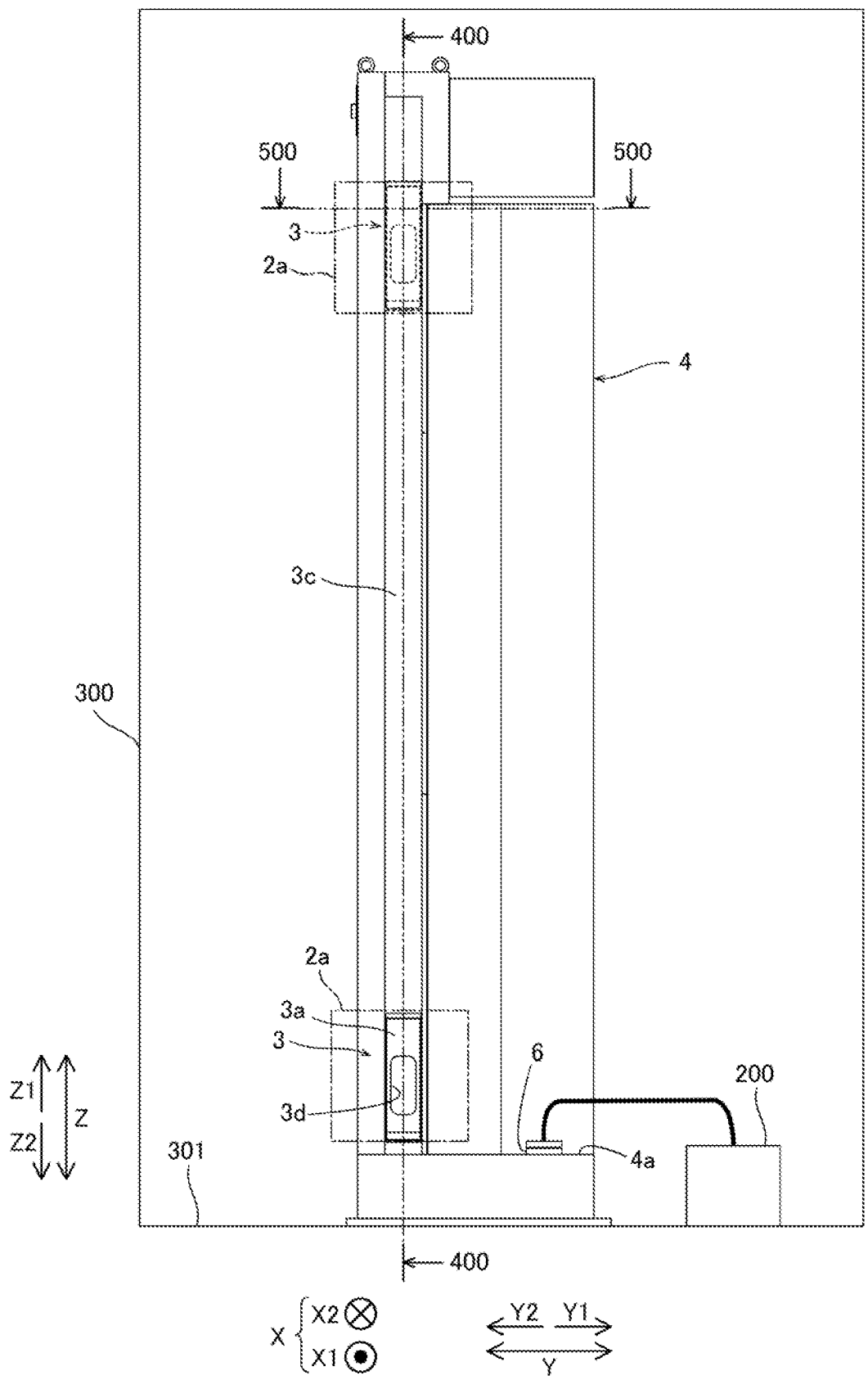
FIG. 3 is a front view (a view from the X1 direction side) of the substrate conveying robot according to the embodiment of the present invention.
Figure 4:
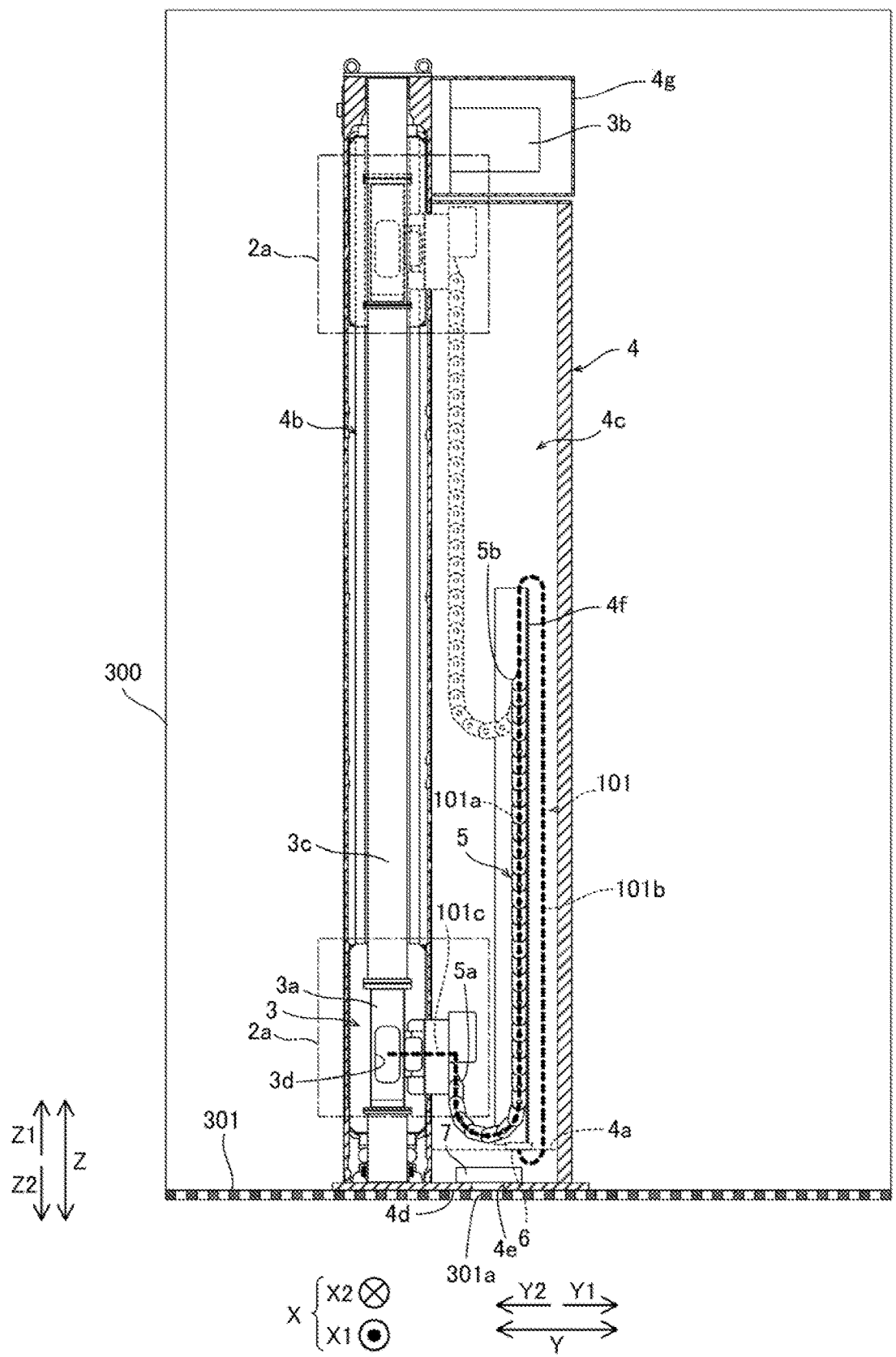
FIG. 4 is a sectional view (a sectional view taken along a Y-Z plane) of the substrate conveying robot according to the embodiment of the present invention.
Figure 5:
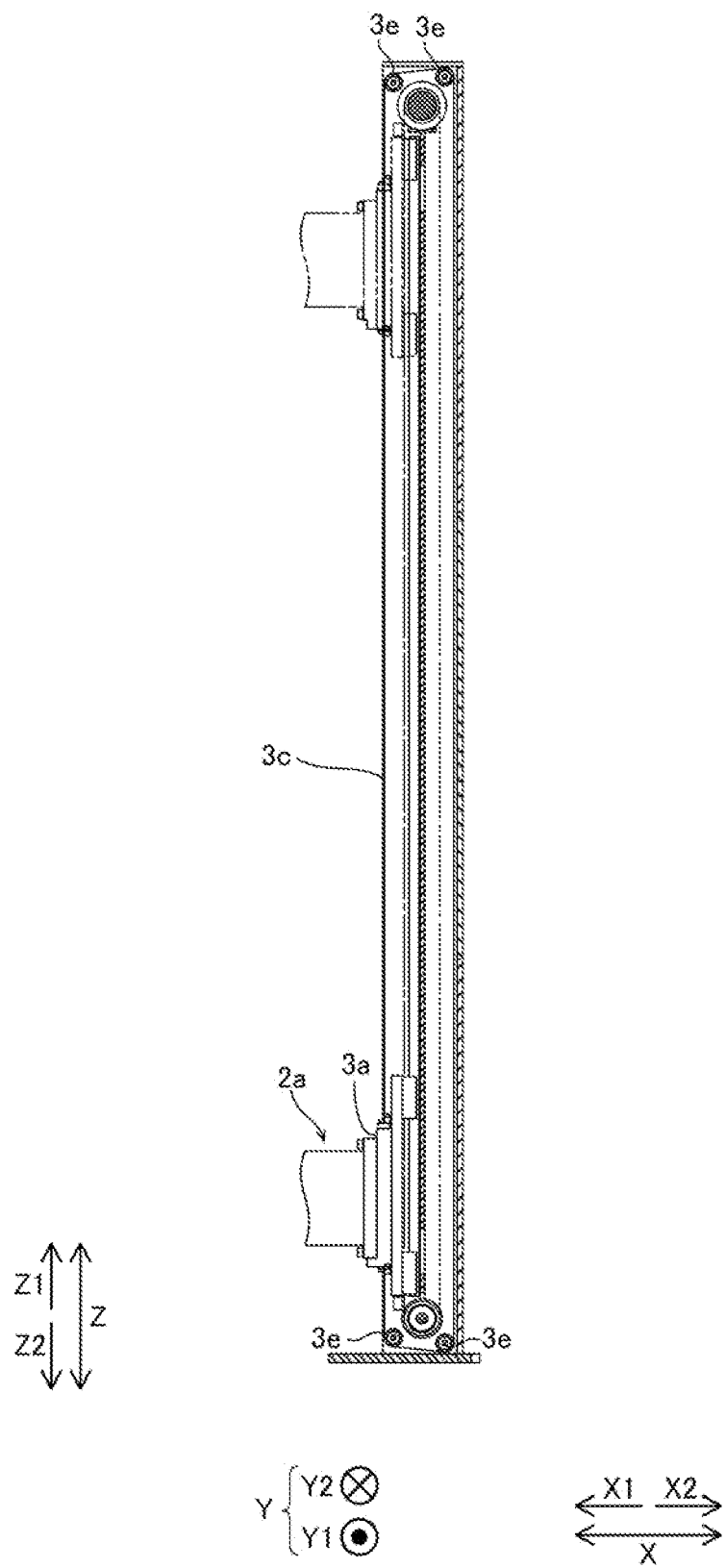
FIG. 5 is a sectional view taken along the line 400-400 in FIG. 3.

As shown in FIGS. 3 to 5, according to this embodiment, the substrate conveying robot 100 includes an arm elevating mechanism 3 that moves the arm 2 up and down, a substantially columnar housing 4 that covers the arm elevating mechanism 3, and a cable guide 5 (cableveyor (registered trademark)) (see FIG. 4) that is arranged inside the housing 4, in which a robot cable 101 extending from the arm 2 is arranged, and that deforms to follow the robot cable 101 moved as the arm 2 is moved up and down.

The substantially columnar housing 4 is made of metal, for example, and has a space inside. Signals are transmitted and received between the substrate conveying robot 100 and a robot controller 200 via the robot cable 101. The cable guide 5 has a function of protecting the robot cable 101 arranged in (connected to) the cable guide 5. Moreover, the cable guide 5 has a structure in which small components like chains are connected to each other.

According to this embodiment, at least a portion of the robot cable 101 is inserted into the cable guide 5, as shown in FIG. 4. Specifically, a central portion of the robot cable 101 is inserted into the cable guide 5, and both ends of the robot cable 101 are arranged outside the cable guide 5.

According to this embodiment, a first end 5a of the cable guide 5 is a moving end that moves as the arm 2 is moved up and down, and a second end 5b of the cable guide 5 is a fixed end that is fixed to the housing 4. Specifically, the robot cable 101 is fixed to the first end 5a and the second end 5b of the cable guide 5. The first end 5a of the cable guide 5 is fixed to an elevator 3a. Thus, the first end 5a of the cable guide 5 and the robot cable 101 fixed to the first end 5a of the cable guide 5 move as the arm 2 is moved up and down. The second end 5b of the cable guide 5 is fixed to a plate-shaped member 4f inside the housing 4. The plate-shaped member 4f is arranged along a Z direction.

According to this embodiment, the robot cable 101 includes a first cable portion 101a that is arranged in the cable guide 5 and is moved as the arm 2 is moved up and down, and a second cable portion 101b that is arranged outside the cable guide 5, is fixed without being moved as the arm 2 is moved up and down, and extends along a vertical direction (Z direction). The substrate conveying robot 100 further includes a connector 6 provided at an end of the second cable portion 101b and connected to the robot controller 200 (see FIG. 3) provided outside the housing 4 to control the substrate conveying robot 100.

Specifically, the first cable portion 101a is the central portion of the robot cable 101. The second cable portion 101b is a first end of the robot cable 101. The second cable portion 101b extends from the Y2 direction side of the plate-shaped member 4f to the Y1 direction side beyond the upper end. The second cable portion 101b is arranged along the plate-shaped member 4f on the Y1 direction side of the plate-shaped member 4f. A third cable portion 101c, which is a second end of the robot cable 101, is arranged outside the cable guide 5.

Figure 7:
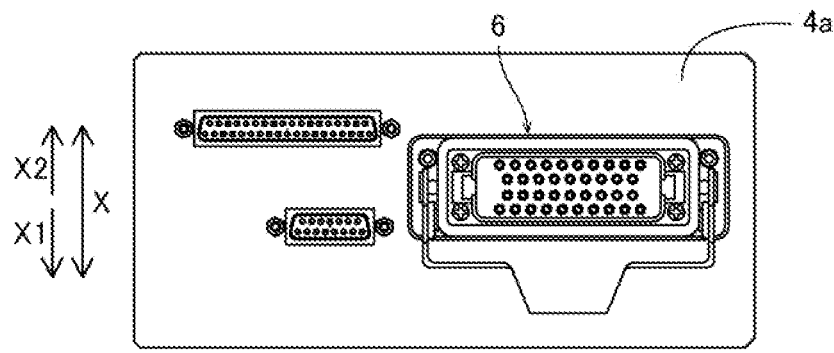
FIG. 7 is a top view (a view from the Z1 direction side) of a connector of the substrate conveying robot according to the embodiment of the present invention.

According to this embodiment, the connector 6 is arranged on the outer surface 4a of the housing 4, as shown in FIGS. 1 and 7. Specifically, a lower portion of the housing 4 has a stepped shape, and the connector 6 is arranged on the outer surface 4a that is the upper surface of the stepped shape. Moreover, the connector 6 extends upward.

As shown in FIGS. 1 and 2, the substrate conveying robot 100 further includes the base 2a to which the arm 2 is attached. As shown in FIG. 4, the arm elevating mechanism 3 includes the elevator 3a to which the base 2a is attached, and a drive 3b (motor) that moves the elevator 3a up and down. The elevator 3a is attached to a conveying belt 3c, and the drive 3b drives the conveying belt 3c to move the elevator 3a up and down. As shown in FIG. 5, the drive 3b (motor) rotates pulleys 3e to move the conveying belt 3c.

The conveying belt 3c is arranged along the Z direction. The pulleys 3e are provided in an upper portion and a lower portion of the housing 4. The conveying belt 3c is wound around the pulleys 3e.

According to this embodiment, as shown in FIG. 4, the drive 3b is arranged at an upper portion of the housing 4. As shown in FIG. 6B, when the drive 3b is arranged at a lower portion of the housing 4, the drive 3b interferes with an air path of a fan 7 that discharges air inside the housing 4 to the outside. Therefore, the drive 3b is arranged at the upper portion of the housing 4 such that interference of the drive 3b with the air path of the fan 7 can be reduced or prevented. The drive 3b is attached to the outside of the housing 4. A cover member 4g is provided on the housing 4 to cover the drive 3b.

Figure 6A:
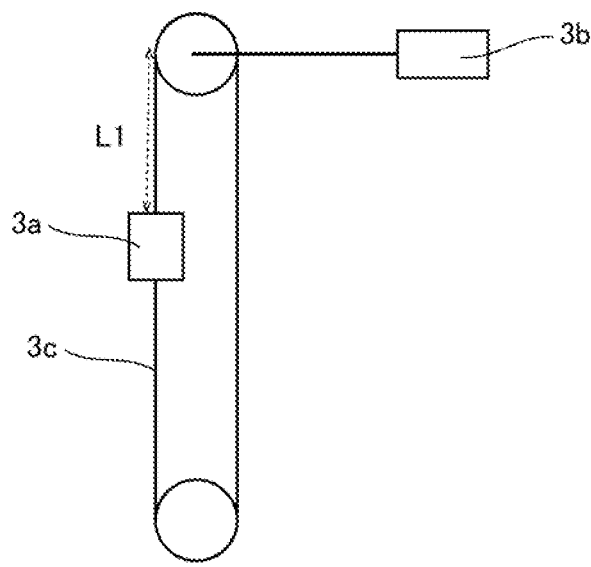
FIG. 6A is a diagram showing a state in which a drive is at an upper portion of a housing.
Figure 6B:
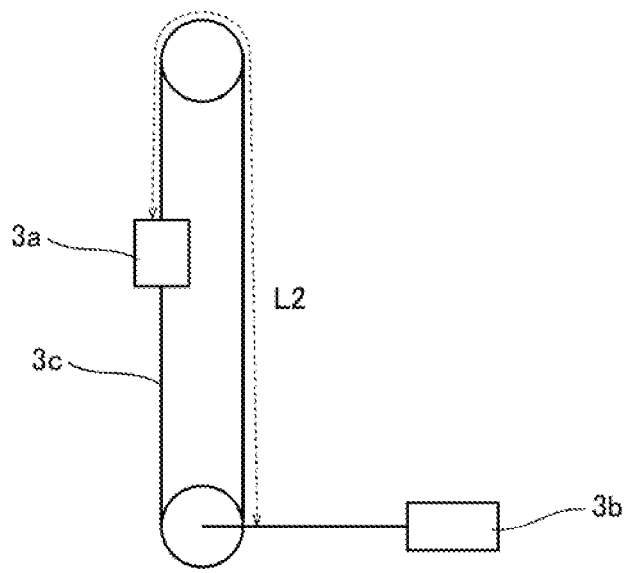
FIG. 6B is a diagram showing a state in which the drive is at a lower portion of the housing.

As shown in FIG. 6A, the drive 3b is arranged at the upper portion of the housing 4 such that as compared with a case in which the drive 3b is arranged at the lower portion of the housing 4 (see FIG. 6B), the length L1 of the conveying belt 3c between the drive 3b and the elevator 3a becomes shorter than the length L2 of the conveying belt 3c in a case in which the drive 3b is arranged at the lower portion of the housing 4, and tension on the conveying belt 3c is increased. Therefore, a tooth skip of the conveying belt 3c can be reduced or prevented. That is, as shown in FIG. 6B, when the length L2 of the conveying belt 3c between the drive 3b and the elevator 3a is increased, the stretch of the conveying belt 3c is increased, and thus a tooth skip easily occurs.

According to this embodiment, as shown in FIGS. 3 and 4, the elevator 3a is exposed from the housing 4, and includes a first hole 3d into which the robot cable 101 extending from the base 2a is inserted. The robot cable 101 extending from the arm 2 is arranged in the cable guide 5 via the first hole 3d of the elevator 3a.

As shown in FIG. 1, the housing 4 includes a convex portion 4h that protrudes in an X1 direction. The third cable portion 101c (see FIG. 4) of the robot cable 101 extends from a first space 4b (see FIG. 8) toward a second space 4c (see FIG. 8) inside the convex portion 4h.

Figure 8:
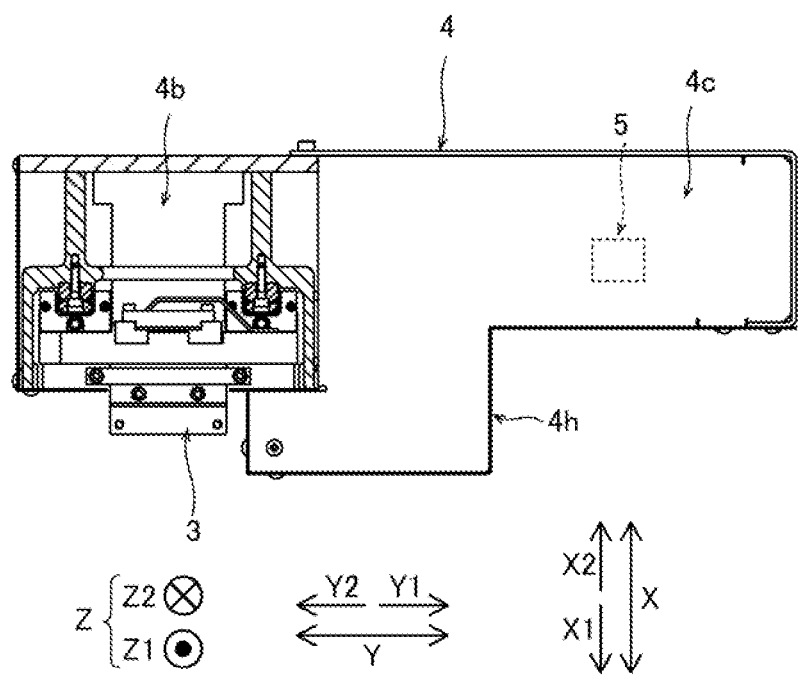
FIG. 8 is a sectional view taken along the line 500-500 in FIG. 3.
Figure 9:
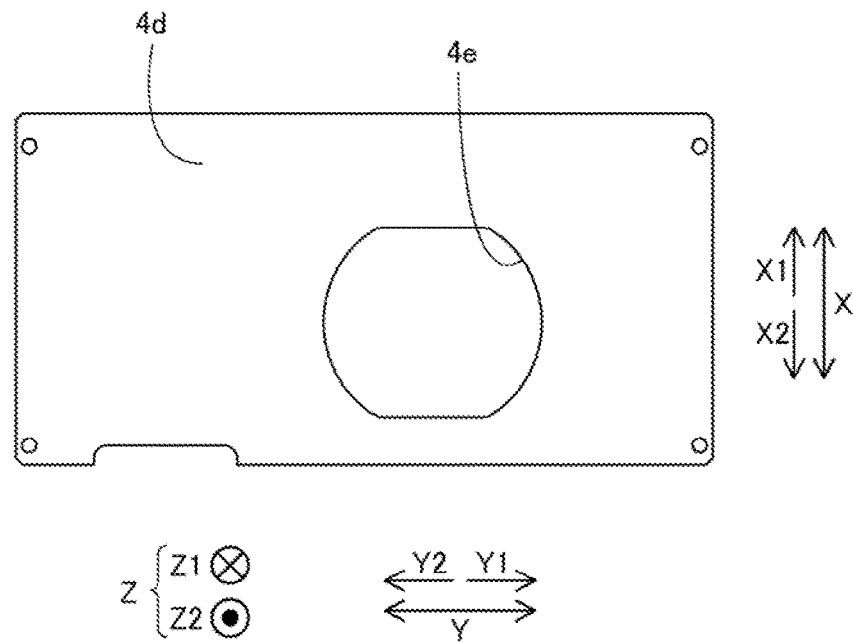
FIG. 9 is a bottom view (a view from the X2 direction side) of the substrate conveying robot according to the embodiment of the present invention.

According to this embodiment, as shown in FIG. 8, the housing 4 includes the first space 4b in which the arm elevating mechanism 3 is arranged and the second space 4c in which the cable guide 5 is arranged. As shown in FIG. 4, the first space 4b and the second space 4c extend in the Z direction. The first space 4b and the second space 4c are arranged adjacent to each other in a Y direction. Furthermore, the first space 4b and the second space 4c are connected to each other. The first space 4b refers to a space of the housing 4 on the Y2 direction side. The second space 4c refers to a space of the housing 4 on the Y1 direction side.

According to this embodiment, as shown in FIG. 4, the substrate conveying robot 100 further includes the fan 7 arranged inside the housing 4 to discharge the air inside the housing 4 to the outside.

Specifically, according to this embodiment, the substrate conveying robot 100 is arranged in a clean room 300, as shown in FIG. 4. The fan 7 is provided in the lower portion of the housing 4 (second space 4c). A second hole 4e (see FIG. 9) through which the air to be discharged by the fan 7 passes is provided in the lower surface 4d of the housing 4. The air discharged by the fan 7 via the second hole 4e is discharged downward (in a Z2 direction) of a floor surface 301 from a third hole 301a provided in the floor surface 301 of the clean room 300.

Advantages of This Embodiment

According to this embodiment, the following advantages are achieved.

According to this embodiment, as described above, the substrate conveying robot 100 includes the cable guide 5 that is arranged inside the housing 4, in which the robot cable 101 extending from the arm 2 is arranged, and that deforms to follow the robot cable 101 moved as the arm 2 is moved up and down. Accordingly, the robot cable 101 and the cable guide 5 are arranged inside the housing 4, and thus even when the robot cable 101 and the cable guide 5 are moved inside the housing 4, spreading of dust and the like outside the housing 4 can be reduced or prevented. Consequently, in a space (in the clean room 300) in which the substrate conveying robot 100 is arranged, spreading of dust and the like can be reduced or prevented.

According to this embodiment, as described above, at least a portion of the robot cable 101 is inserted into the cable guide 5. Accordingly, at least a portion of the robot cable 101 is inserted into the cable guide 5, and thus the robot cable 101 can be easily moved as the cable guide 5 is moved. Furthermore, at least a portion of the robot cable 101 is inserted into the cable guide 5 such that a space occupied by the robot cable 101 in the housing 4 can be reduced as compared with a case in which the entire robot cable 101 is arranged outside the cable guide 5, and thus the size of the housing 4 can be reduced.

According to this embodiment, as described above, the first end 5a of the cable guide 5 is a moving end that moves as the arm 2 is moved up and down, and the second end 5b of the cable guide 5 is a fixed end that is fixed to the housing 4. Accordingly, the cable guide 5 can be moved (deformed) as the arm 2 is moved up and down while the second end 5b of the cable guide 5 is fixed.

According to this embodiment, as described above, the robot cable 101 includes the first cable portion 101a arranged in the cable guide 5 and moved as the arm 2 is moved up and down, and the second cable portion 101b arranged outside the cable guide 5, fixed without being moved as the arm 2 is moved up and down, and extending along the vertical direction. The substrate conveying robot 100 further includes the connector 6 provided at the end of the second cable portion 101b and connected to the robot controller 200 provided outside the housing 4 and configured or programmed to control the substrate conveying robot 100. Accordingly, the robot cable 101 can be connected to the robot controller 200 configured or programmed to control the substrate conveying robot 100 by the connector 6 provided outside the housing 4, and thus the robot cable 101 can be easily connected to the robot controller 200.

According to this embodiment, as described above, the connector 6 is arranged on the outer surface 4a of the housing 4. Accordingly, the robot cable 101 can be easily connected to the robot controller 200 by simply connecting the robot controller 200 to the connector 6 arranged on the outer surface 4a of the housing 4.

According to this embodiment, as described above, the substrate conveying robot 100 further includes the base 2a to which the arm 2 is attached, and the arm elevating mechanism 3 includes the elevator 3a to which the base 2a is attached, and the drive 3b to move the elevator 3a up and down. Accordingly, the arm 2 can be easily moved up and down by the drive 3b moving up and down the elevator 3a.

According to this embodiment, as described above, the drive 3b is arranged at the upper portion of the housing 4. Accordingly, interference of the drive 3b with the cable guide 5 can be reduced or prevented.

According to this embodiment, as described above, the elevator 3a is exposed from the housing 4 and includes the first hole 3d into which the robot cable 101 extending from the base 2a is inserted, and the robot cable 101 extending from the arm 2 is arranged in the cable guide 5 via the first hole 3d of the elevator 3a. Accordingly, the robot cable 101 arranged in the cable guide 5 via the first hole 3d can be easily moved as the elevator 3a is moved.

According to this embodiment, as described above, the housing 4 includes the first space 4b in which the arm elevating mechanism 3 is arranged and the second space 4c in which the cable guide 5 is arranged. Accordingly, the arm elevating mechanism 3 and the cable guide 5 are arranged in separate spaces, and thus interference of the arm elevating mechanism 3 with the cable guide 5 can be reduced or prevented.

According to this embodiment, as described above, the substrate conveying robot 100 further includes the fan 7 arranged inside the housing 4 to discharge the air inside the housing 4 to the outside. Accordingly, dust and the like generated inside the housing 4 can be discharged to the outside of the housing 4.

According to this embodiment, as described above, the substrate conveying robot 100 is arranged in the clean room 300, the fan 7 is provided in the lower portion of the housing 4, the housing 4 includes the lower surface 4d including the second hole 4e through which the air to be discharged by the fan 7 passes, and the air discharged by the fan 7 via the second hole 4e is discharged downward of the floor surface 301 from the third hole 301a provided in the floor surface 301 of the clean room 300. Accordingly, when dust and the like generated inside the housing 4 is discharged to the outside of the housing 4, spreading of the dust and the like discharged from the housing 4 into the clean room 300 can be reduced or prevented.

Modified Examples

The embodiment disclosed this time must be considered as illustrative in all points and not restrictive. The scope of the present invention is not shown by the above description of the embodiment but by the scope of claims for patent, and all modifications (modified examples) within the meaning and scope equivalent to the scope of claims for patent are further included.

For example, while the example in which a cableveyor (registered trademark) is applied as the cable guide 5 has been shown in the aforementioned embodiment, the present invention is not limited to this. In the present invention, a cable guide other than a cableveyor (registered trademark) may be applied as the cable guide 5.

While the example in which a portion of the robot cable 101 is inserted into the cable guide 5 has been shown in the aforementioned embodiment, the present invention is not limited to this. For example, the entire robot cable 101 may be inserted into the cable guide 5. Alternatively, the entire robot cable 101 may be attached to the outside of the cable guide 5.

While the example in which the second end 5b of the cable guide 5 is a fixed end that is fixed to the housing 4 has been shown in the aforementioned embodiment, the present invention is not limited to this. For example, the second end 5b of the cable guide 5 may be a moving end.

While the example in which the connector 6 is arranged on the outer surface 4a, which is the upper surface of the stepped shape of the housing 4, has been shown in the aforementioned embodiment, the present invention is not limited to this. For example, the connector 6 may be arranged on a side surface (a surface on the X direction side or a surface on the Y direction side) of the housing 4.

While the example in which the arm elevating mechanism 3 includes the elevator 3a, the conveying belt 3c to which the elevator 3a is attached, and the drive 3b (motor) that drives the conveying belt 3c has been shown in the aforementioned embodiment, the present invention is not limited to this. For example, the arm elevating mechanism may include a ball screw that converts rotational movement of a motor or the like into linear movement and the elevator 3a attached to the ball screw.

While the example in which the drive 3b is arranged at the upper portion of the housing 4 has been shown in the aforementioned embodiment, the present invention is not limited to this. As long as the drive 3b does not interfere with the air path of the fan 7, the drive 3b may be arranged at the lower portion of the housing 4.

While the example in which the robot cable 101 extending from the arm 2 is arranged in the cable guide 5 via the first hole 3d of the elevator 3a has been shown in the aforementioned embodiment, the present invention is not limited to this. For example, a notch may be provided in the elevator 3a instead of the first hole 3d, and the robot cable 101 may be arranged in the cable guide 5 via the notch.

While the example in which the fan 7 is provided in the lower portion of the housing 4 has been shown in the aforementioned embodiment, the present invention is not limited to this. For example, the fan 7 may be provided in an upper portion of the housing 4 to discharge the air inside the housing 4 from the third hole 301a of the floor surface 301.

Figure 10:
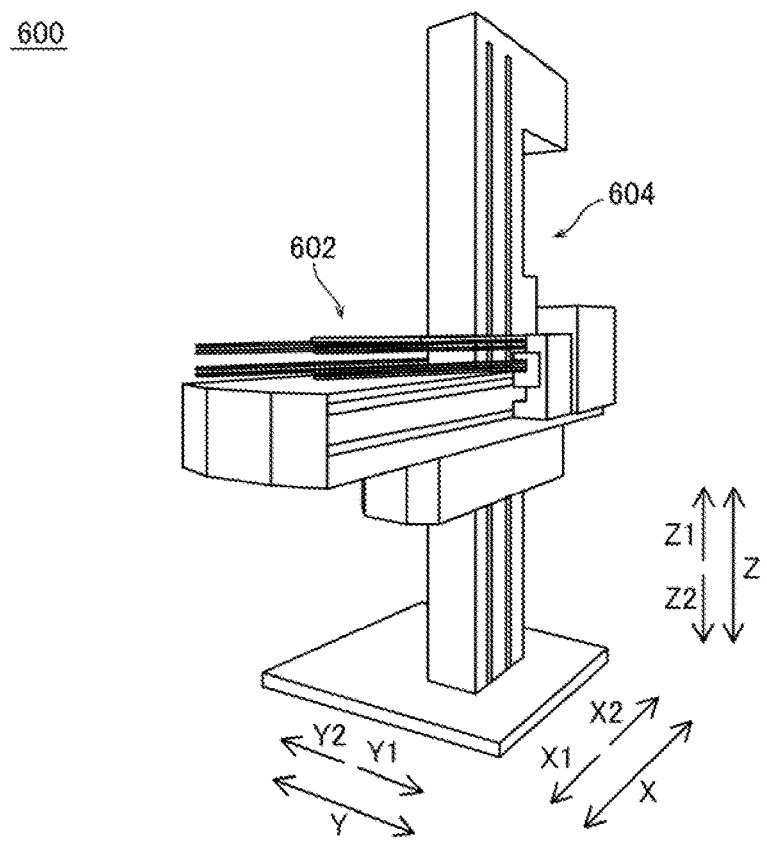
FIG. 10 is a perspective view of a substrate conveying robot according to a modified example.

While the example in which the arm 2 of the substrate conveying robot 100 is a horizontal articulated robot arm has been shown in the aforementioned embodiment, the present invention is not limited to this. For example, as in a substrate conveying robot 600 according to a modified example shown in FIG. 10, an arm 602 may be linearly moved along an X direction. The arm 602 of the substrate conveying robot 600 is moved up and down along a Z direction with respect to a substantially columnar housing 604.

DESCRIPTION OF REFERENCE NUMERALS

1: substrate holding hand
2: arm
2a: base
3: arm elevating mechanism
3a: elevator
3b: drive
3d: first hole
4: housing
4a: outer surface
4b: first space
4c: second space
4d: lower surface
4e: second hole
5: cable guide
5a: first end (of the cable guide)
5b: second end (of the cable guide)
6: connector
7: fan
100: substrate conveying robot
101: robot cable
101a: first cable portion
101b: second cable portion
200: robot controller
300: clean room
301: floor surface
301a: third hole

The invention claimed is:

1. A substrate conveying robot comprising:
a substrate holding hand;
an arm to move the substrate holding hand;
an arm elevating mechanism to move the arm up and down;
a substantially columnar housing to cover the arm elevating mechanism;
a cable guide that is arranged inside the housing, in which a robot cable extending from the arm is arranged, and that deforms to follow the robot cable moved as the arm is moved up and down; and
a plate-shaped member that is arranged inside the housing and is spaced apart from an inner wall surface of the housing, wherein:
one end of the cable guide is fixed to the plate-shaped member;
the robot cable includes:
a first cable portion arranged in the cable guide and moved as the arm is moved up and down; and
a second cable portion arranged outside the cable guide, fixed without being moved as the arm is moved up and down, and extending along a vertical direction within a space between the plate-shaped member and the inner wall surface of the housing; and
the cable guide covers only the first cable portion.

2. The substrate conveying robot according to claim 1, wherein the first cable portion of the robot cable is inserted into the cable guide.

3. The substrate conveying robot according to claim 1, wherein
a first end of the cable guide is a moving end that moves as the arm is moved up and down; and
a second end of the cable guide is the one end that is fixed to the plate-shaped member.

4. The substrate conveying robot according to claim 1, further comprising
a connector provided at an end of the second cable portion and connected to a robot controller provided outside the housing and configured or programmed to control the substrate conveying robot.

5. The substrate conveying robot according to claim 4, wherein the connector is arranged on an outer surface of the housing.

6. The substrate conveying robot according to claim 1, further comprising:
a base to which the arm is attached; wherein
the arm elevating mechanism includes:
an elevator to which the base is attached; and
a drive to move the elevator up and down.

7. The substrate conveying robot according to claim 6, wherein the drive is arranged at an upper portion of the housing.

8. The substrate conveying robot according to claim 6, wherein
the elevator is exposed from the housing and includes a first hole into which the robot cable extending from the base is inserted; and
the robot cable extending from the arm is arranged in the cable guide via the first hole of the elevator.

9. The substrate conveying robot according to claim 1, wherein the housing includes a first space in which the arm elevating mechanism is arranged and a second space in which the cable guide is arranged.

10. The substrate conveying robot according to claim 9, wherein the first space and the second space are separate spaces that are arranged side-by-side along a horizontal direction perpendicular to the vertical direction.

11. The substrate conveying robot according to claim 1, further comprising:
a fan arranged inside the housing to discharge air inside the housing to an outside.

12. The substrate conveying robot according to claim 11, wherein
the substrate conveying robot is arranged in a clean room;
the fan is provided in a lower portion of the housing;
the housing includes a lower surface including a second hole through which the air to be discharged by the fan passes; and
the air discharged by the fan via the second hole is discharged downward of a floor surface of the clean room from a third hole provided in the floor surface.

13. The substrate conveying robot according to claim 1, wherein
the second cable portion extends beyond and over an upper end of the plate-shaped member so as to extend along an entire vertical length of the plate-shaped member.

* * * * *